United States Patent
Nikitin et al.

(10) Patent No.: US 7,315,993 B2
(45) Date of Patent: Jan. 1, 2008

(54) VERIFICATION OF RRAM TILING NETLIST

(75) Inventors: Andrey A. Nikitin, Moscow (RU); Alexander E. Andreev, San Jose, CA (US); Ranko Scepanovic, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 410 days.

(21) Appl. No.: 10/999,468

(22) Filed: Nov. 30, 2004

(65) Prior Publication Data

US 2006/0117281 A1    Jun. 1, 2006

(51) Int. Cl.
*G06F 9/45* (2006.01)
*G06F 17/50* (2006.01)
*G06F 11/00* (2006.01)
*G11C 29/00* (2006.01)

(52) U.S. Cl. .................. 716/5; 716/1; 716/4; 716/6; 703/13; 703/14; 714/718; 714/738

(58) Field of Classification Search .............. 716/1–6, 716/9, 11, 16; 714/718, 726, 727, 738; 713/502; 711/170; 707/1; 703/13, 14; 702/117; 365/201, 365/200; 717/136
See application file for complete search history.

(56) References Cited

U.S. PATENT DOCUMENTS

| | | | | |
|---|---|---|---|---|
| 5,680,332 A * | 10/1997 | Raimi et al. | ................ | 703/13 |
| 5,734,798 A * | 3/1998 | Allred | ................ | 706/47 |
| 5,812,414 A * | 9/1998 | Butts et al. | ................ | 716/16 |
| 5,910,958 A * | 6/1999 | Jay et al. | ................ | 714/738 |
| 5,940,603 A * | 8/1999 | Huang | ................ | 716/5 |
| 6,078,735 A * | 6/2000 | Baxter | ................ | 716/3 |
| 6,115,300 A * | 9/2000 | Massoumi et al. | ................ | 365/200 |
| 6,151,568 A * | 11/2000 | Allen et al. | ................ | 703/14 |
| 6,181,614 B1* | 1/2001 | Aipperspach et al. | ................ | 365/200 |
| 6,195,776 B1* | 2/2001 | Ruiz et al. | ................ | 714/738 |
| 6,249,901 B1* | 6/2001 | Yuan et al. | ................ | 716/5 |
| 6,295,627 B1* | 9/2001 | Gowni et al. | ................ | 716/1 |
| 6,345,379 B1* | 2/2002 | Khouja et al. | ................ | 716/4 |
| 6,523,155 B1* | 2/2003 | Ruedinger | ................ | 716/7 |
| 6,618,311 B1* | 9/2003 | Becker | ................ | 365/225.7 |
| 6,667,917 B1* | 12/2003 | Templeton et al. | ................ | 365/201 |
| 6,823,502 B2* | 11/2004 | Wingren et al. | ................ | 716/9 |
| 6,964,029 B2* | 11/2005 | Poznanovic et al. | ................ | 716/7 |

(Continued)

OTHER PUBLICATIONS

Haddad et al.; "Increased throughput for the testing and repair of RAMs with redundancy", Feb. 1991, Computers, IEEE Transactions on, vol. 40, Issue 2, pp. 154-166.*

(Continued)

*Primary Examiner*—Stacy A Whitmore
*Assistant Examiner*—Helen Rossoshek
(74) *Attorney, Agent, or Firm*—Suiter Swantz PC LLO

(57) ABSTRACT

The present invention provides a method of verification of a RRAM tiling netlist. The method may include steps as follows. Properties "memory_number", "clock_number" and "netlist_part" of all nets and cells of a RRAM tiling netlist are set to a value 0. A boolean value 0 is assigned to all ground nets of the RRAM tiling netlist, and a boolean value 1 is assigned to all power nets of the RRAM tiling netlist. The RRAM tiling netlist is verified for each customer memory $Mem_k$, k=1, 2, . . . , N.

20 Claims, 2 Drawing Sheets

U.S. PATENT DOCUMENTS

| | | | |
|---|---|---|---|
| 6,993,731 B2* | 1/2006 | Whitaker et al. | 716/3 |
| 7,069,522 B1* | 6/2006 | Sluss et al. | 716/1 |
| 7,149,142 B1* | 12/2006 | Fisher et al. | 365/229 |
| 7,155,685 B2* | 12/2006 | Mori et al. | 716/2 |
| 7,155,688 B2* | 12/2006 | Andreev et al. | 716/3 |
| 7,171,640 B2* | 1/2007 | Terai et al. | 716/5 |
| 7,181,359 B2* | 2/2007 | Goyal | 702/117 |
| 2003/0172055 A1* | 9/2003 | Prakash et al. | 707/1 |
| 2004/0123262 A1* | 6/2004 | Shirota et al. | 716/14 |
| 2004/0261044 A1* | 12/2004 | Yonezawa | 716/4 |
| 2005/0097416 A1* | 5/2005 | Plunkett | 714/727 |
| 2005/0125707 A1* | 6/2005 | Bonaccio et al. | 713/502 |
| 2005/0240746 A1* | 10/2005 | Nikitin et al. | 711/170 |
| 2005/0273683 A1* | 12/2005 | Cote et al. | 714/726 |
| 2006/0061795 A1* | 3/2006 | Walmsley | 358/1.14 |
| 2006/0064664 A1* | 3/2006 | Faber et al. | 716/16 |

OTHER PUBLICATIONS

Low et al.; "Minimum fault coverage in memory arrays: a fast algorithm and probabilistic analysis", Jun. 1996, Computer-Aided Design of Integrated Circuits and Systems, IEEE Transactions on, vol. 15, Issue 6, pp. 681-690.*

Lin et al.; "An efficient algorithm for reconfiguring shared spare RRAM", Oct. 11-13, 2004, Computer Design: VLSI in Computers and Processors, Proceedings. IEEE International Conference on, pp. 544-546.*

* cited by examiner

VERIFICATION OF RRAM TILING NETLIST

FIELD OF THE INVENTION

The present invention generally relates to the field of integrated circuits, particularly to verification of a RRAM tiling netlist.

BACKGROUND OF THE INVENTION

Platform-based IC (integrated circuit) design is a powerful concept for coping with the increased pressure on time-to-market, design and manufacturing costs encountered in the current IC market. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. RapidChip™ developed by LSI Logic Corp. is an instance of a platform. The basic idea behind the platform-based design is to avoid designing and manufacturing a chip from scratch. Some portion of the chip's architecture is predefined for a specific type of application. Through extensive design reuse, the platform-based design may provide faster time-to-market and reduced design cost.

Under a platform approach, there are two distinct steps entailed in creating a final end-user product: a prefabrication step and a customization step. In a prefabrication step, a slice is built on a wafer. A slice is a pre-manufactured chip in which all silicon layers have been built, leaving the metal layers or top metal layers to be completed with the customer'unique IP. For example, RapidSlice™ developed by LSI Logic Corp. is an instance of a slice. One or more slices may be built on a single wafer. It is understood that a slice may include one or more bottom metal layers or may include no metal layers at all. In a preferred embodiment of the prefabrication step, portions of the metal layers are pre-specified to implement the pre-defined blocks of the platform and the diffusion processes are carried out in a wafer fab. The base characteristics, in terms of the IP, the processors, the memory, the interconnect, the programmable logic and the customizable transistor array, are all pre-placed in the design and pre-diffused in the slice. However, a slice is still fully decoupled because the customer has not yet introduced the function into the slice. In a customization step, the customer-designed function is merged with the pre-defined blocks and the metal layers (or late-metal components) are laid down, which couple the elements that make up the slice built in the wafer fab, and the customizable transistor array is configured and given its characteristic function. In other embodiments, early-metal steps may be part of the pre-fabricated slice to reduce the time and cost of the customization step, resulting in a platform which is more coupled and specific. It is understood that a prefabrication step and a customization step may be performed in different foundries. For example, a slice may be manufactured in one foundry. Later, in a customization step, the slice may be pulled from inventory and metalized, which gives the slice its final product characteristics in a different foundry.

A slice such as RapidSlice™ may contain several RRAMs (Reconfigurable RAMs, or Redundant RAMs, or RapidSlice™ RAMs). Each RRAM is a set of memories of the same type that are placed compactly. RRAMs include built-in testing and self-repairing components. While being mapped to a slice, each customer memory (i.e., a memory of customer design) is presented as a tiling netlist, which is a netlist including RRAM memories, flip-flops and/or logical cells. A RRAM tiling netlist is a netlist that represents a unity of the netlists that correspond to all customer memories mapped to one given RRAM.

Thus, it would be desirable to provide an algorithm of verification of a RRAM tiling netlist (i.e., an algorithm that verifies whether a RRAM tiling netlist actually presents the set of customer memories as provided).

SUMMARY OF THE INVENTION

In an exemplary aspect, the present invention provides a method of verification of a RRAM tiling netlist. The method may include steps as follows. Properties "memory_number", "clock_number" and "netlist_part" of all nets and cells of a RRAM tiling netlist are set to a value 0. A boolean function 0 is assigned to all ground nets of the RRAM tiling netlist, and a boolean function 1 is assigned to all power nets of the RRAM tiling netlist. The RRAM tiling netlist is verified for each customer memory $Mem_k$, k=1, 2, ..., N. In a preferred embodiment, the RRAM tiling netlist is verified for a customer memory $Mem_k$ as follows. Inputs of the RRAM tiling netlist that correspond to inputs of the memory $Mem_k$ are analyzed, and a boolean variable is assigned to each of the inputs of the RRAM. Boolean functions are evaluated and assigned to nets encountered when moving around the RRAM tiling netlist starting from inputs toward memories and flip-flops, and property "netlist_part" of all encountered nets and cells is set to value 1, MARKED_CELLS being a set of encountered cells that are not evaluated yet, PROCESSED_CELLS being a set of encountered cells that are already evaluated. Equivalent pairs of bits $(x_{a,b})$ stored in the memory $Mem_k$ and bits $(y_{i,j})$ stored in internal memories of the RRAM tiling netlist are found, and a "dummy" variable $z_{Z\_MEM\_NUM}$ is assigned to a bit $y_{i,j}$ of the internal memories when the bit $y_{i,j}$ has no equivalent bit in the memory $Mem_k$. Boolean functions are assigned to nets connected to outputs of internal RRAM memories and flip-flops sets. Boolean functions are evaluated and assigned to nets encountered when moving around the RRAM tiling netlist starting from outputs of memories and flip-flops of the RRAM tiling netlist toward outputs of the RRAM tiling netlist, and property "netlist_part" of all encountered nets and cells to is set to a value 2. The outputs of the RRAM tiling netlist that correspond to outputs of the memory $Mem_k$ are analyzed, and it is ensured that boolean functions of the outputs of the RRAM tiling netlist are evaluated and correct.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1:
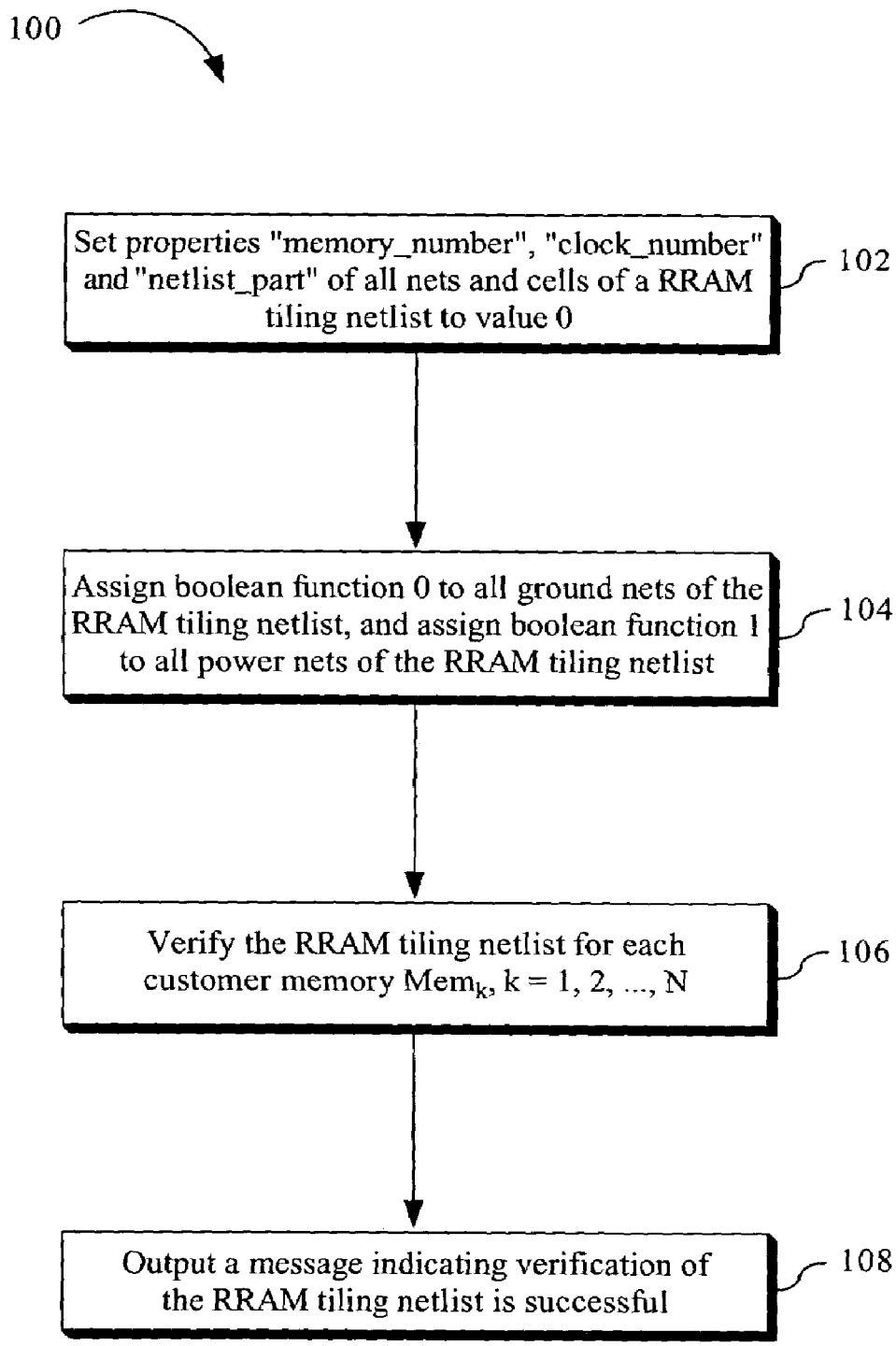
FIG. 1 is a flow diagram of a method of verification of a RRAM tiling netlist in accordance with an exemplary embodiment of the present invention, wherein the method includes a step of verifying the RRAM tiling netlist for each customer memory $Mem_k$, k=1, 2, ..., N.

Reference will now be made in detail to the presently preferred embodiments of the invention, examples of which are illustrated in the accompanying drawings.

The present invention provides a method or algorithm of verification of a RRAM tiling netlist. As an example, the present invention uses RRAMs that contain only 222 memories and assumes customer memories are also of type 222. However, those of ordinary skill in the art will understand that the present method may be applied to any RRAMs without departing from the scope and spirit of the present invention. The 222 memory is a memory that may process 2 read/write operations in parallel. These 2 operations may be driven by 2 different clocks. Each 222-memory of a width W and a capacity CAP has the following set of ports:

inputs CLKA, ENA, DIA[0:W−1], WEA[0:W−1], AADR [0:LCAP−1]; outputs DOA[0:W−1]; and inputs CLKB, ENB, DIB[0:W−1], WEB[0:W−1], BADR [0:LCAP−1]; outputs DOB[0:W−1];

where LCAP is the minimal integer number that is not less than $\log_2 CAP$.

The inputs CLKA and CLKB are clock inputs of the memory. The ports ENA, DIA[0:W−1], WEA[0:W−1], AADR[0:LCAP−1] and DOA[0:W−1] correspond to the clock CLKA. The ports ENB, DIB[0:W−1], WEB[0:W−1], BADR[0:LCAP−1] and DOB[0:W−1] correspond to the clock CLKB. The inputs ENA and ENB are enable inputs. The inputs DIA and DIB are data inputs, WEA and WEB are write enable inputs, AADR and BADR are address inputs, and the outputs DOA and DOB are data outputs.

Let $Mem_1$, $Mem_2$, . . . , $Mem_N$ be customer memories mapped to the RRAM, where N is the number of these memories. Let $W_k$ and $CAP_k$ be the width and capacity of the customer memory $Mem_k$, k=1, 2, . . . , N, respectfully. As the input of the present verification algorithm, customer memory ports are correspondingly defined. For each port PORT of each memory $Mem_k$, the corresponding net NET (PORT, $Mem_k$) of the RRAM tiling netlist is defined.

The present algorithm of verification deals with construction and comparison of logical (or boolean) functions. The construction of boolean functions may be reduced to applying operations (e.g., OR, AND, NAND, NOR, and the like) to existing boolean functions. The BDD (binary decision diagram) technique may be used to effectively organize the boolean function comparison and the boolean function operations.

The present algorithm uses 2 sets of RRAM tiling netlist cells: MARKED_CELLS and PROCESSED_CELLS. During the algorithm execution, cells of the RRAM tiling netlist may be added to or removed from these two sets.

Each net (including inputs and outputs) and each cell of the RRAM tiling netlist has 3 properties: "memory_number", "clock_number" and "netlist_part". The property "memory_number" may take values 0, 1, 2, . . . , N and indicates the number of customer memory to which the given net/cell corresponds (the value 0 is used if there is no corresponding memory). The property "clock_number" may take values 0, 1, 2 and represents the number of clock (CLKA−1, CLKB−2) that drives the given net/cell (the value 0 is used if there is no clock that drives a net/cell). The property "netlist_part" may take values 0, 1, 2 and is a special property that is used for understanding the position of the given net/cell in the RRAM tiling netlist. The value 1 is used for the property "netlist_part" if the given net/cell lies on a logical path that connects a RRAM tiling netlist input with an input of an internal RRAM memory or flip-flop. The value 2 is used if the given net/cell lies on a logical path that connects an output of an internal RRAM memory or flip-flop with a RRAM tiling netlist output.

According to the present invention, boolean functions (or boolean variables that may be also considered as boolean functions) are assigned to nets of the RRAM tiling netlist. If no boolean function is assigned to a net, then the net is defined as not evaluated. If all the nets connected to inputs of a cell of a RRAM tiling netlist are already evaluated, then the cell is defined as ready for evaluation. If all the nets connected to outputs of a cell of a RRAM tiling netlist are evaluated, then the cell is defined as evaluated Referring now to FIG. 1, a flow diagram of a method 100 of verification of a RRAM tiling netlist in accordance with an exemplary embodiment of the present invention is shown. The method 100 may include steps as follows. At step 102, properties "memory_number", "clock_number" and "netlist_part" of all nets and cells of a RRAM tiling netlist are set to a value 0. A boolean function 0 is assigned to all ground nets of the RRAM tiling netlist, and a boolean function 1 is assigned to all power nets of the RRAM tiling netlist 104. At step 106, the RRAM tiling netlist is verified for each customer memory $Mem_k$, k=1, 2, . . . , N. Optionally, a message indicating verification of the RRAM tiling netlist is successfully is output 108.

Figure 2:
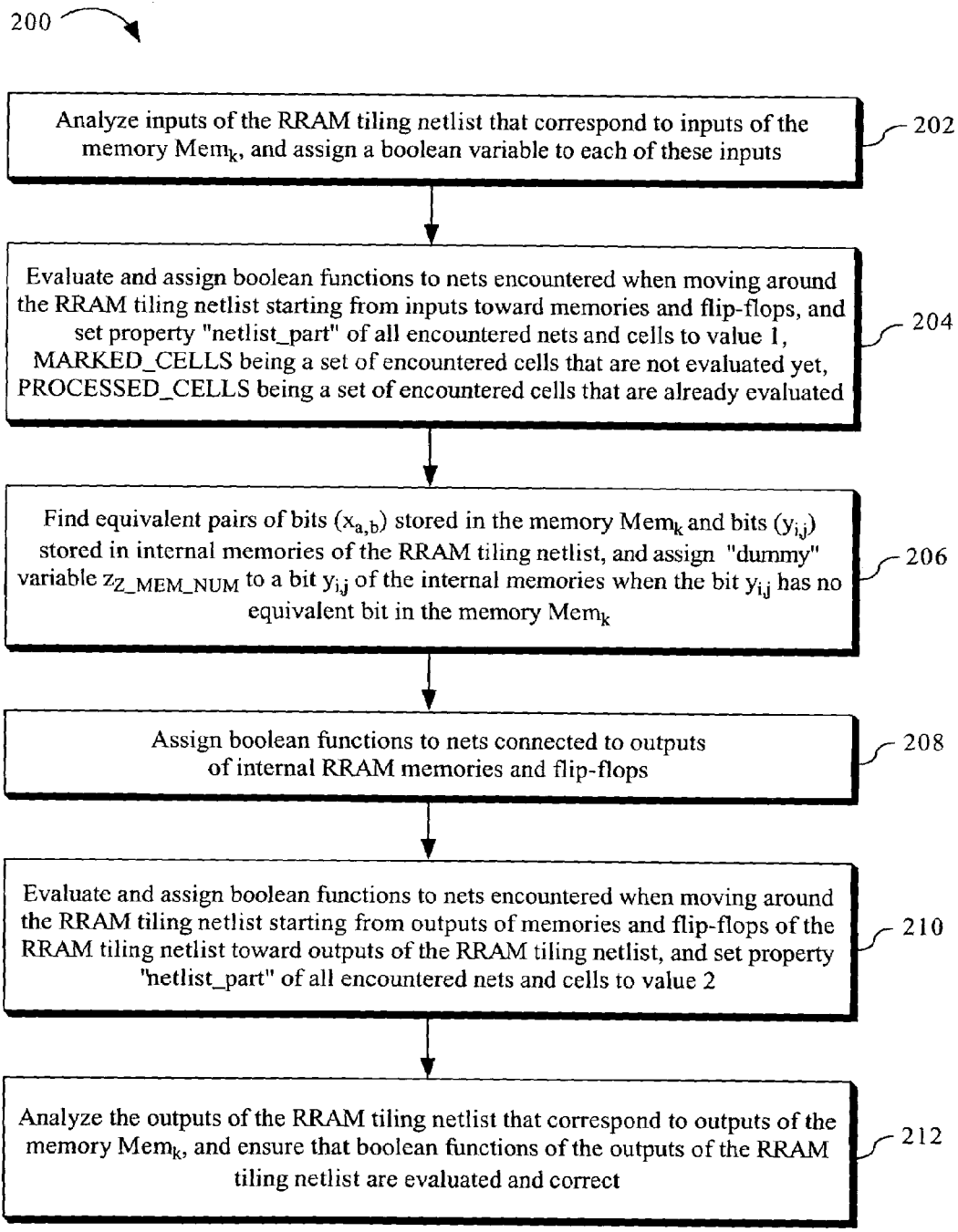
FIG. 2 is a flow diagram of a method for implementing the step of verifying the RRAM tiling netlist for each customer memory $Mem_k$, k=1, 2, . . . , N illustrated in FIG. 1 in accordance with an exemplary embodiment of the present invention.

FIG. 2 is a flow diagram of a method 200 for implementing the step 106 of verifying the RRAM tiling netlist for each customer memory $Mem_k$, k=1, 2, . . . , N illustrated in FIG. 1 in accordance with an exemplary embodiment of the present invention. The method 200 may include steps as follows. At step 202, inputs of the RRAM tiling netlist that correspond to inputs of the memory $Mem_k$ are analyzed, and a boolean variable is assigned to each of the inputs of the RRAM. In an exemplary embodiment of the step 202, the following sub-steps are implemented:

(i) Define the boolean variables that are used for the construction of boolean functions and assigned to RRAM tiling netlist nets as follows: "clock", "enable", "$addr_r$", "$we_s$", "$di_s$", "$x_{s,r}$", s=0, 1, . . . , $W_k$−1, t=0, 1, . . . , $LCAP_k$−1, r=0, 1, . . . , $CAP_k$−1. Define infinite set of variables "$z_1$", "$z_2$", "$z_3$", . . . . Set Z_VAR_ NUM=0, where Z_VAR_NUM is the number of variables "z" that are used by the present algorithm;

(ii) Clean sets MARKED_CELLS and PROCESSED_ CELLS;

(iii) Examine all the nets NET(A_INPUT, $Mem_k$) of the RRAM tiling netlist for each input A_INPUT of memory $Mem_k$ driven by clock CLKA (these are inputs CLKA, ENA, DIA[0:$W_k$−1], WEA[0:$W_k$−1], AADR [0:$LCAP_k$−1]). For each examined net NET, check if the value of its property "memory_number" is 0. If the value is not 0, then output a message indicating that verification is failed; otherwise, set properties of the net NET: memory_number=k, clock_number=1, netlist_ part=1;

(iv) Examine all the nets NET(B_INPUT, $Mem_k$) of the RRAM tiling netlist for each input B_INPUT of memory $Mem_k$ driven by clock CLKB (these are inputs CLKB, ENB, DIB[0:$W_k$−1], WEB[0:$W_k$−1], BADR[0:

LCAP$_k$-1]). For each examined net NET, check if the value of its property "memory_number" is 0. If the value is not 0, then output a message indicating that verification is failed; otherwise, set properties of the net NET: memory_number=k, clock_number=2, netlist_part=1; and (v) Assign the boolean variable "clock" to the nets NET (CLKA, Mem$_k$) and NET(CLKB, Mem$_k$). Assign the boolean variable "enable" to nets NET(ENA, Mem$_k$) and NET(ENB, Mem$_k$). Assign the boolean variable "di$_s$" to the nets NET(DIA[s], Mem$_k$) and NET(DIB[s], Mem$_k$) and assign the boolean variable "we$_s$" to the nets NET(WEA[s], Mem$_k$) and NET(WEB[s], Mem$_k$), where s=0, 1, . . . , W$_k$-1. Assign the boolean variable "addr$_t$" to the nets NET(AADR[t], Mem$_k$) and NET (BADR[t], Mem$_k$), where t=0, 1, . . . , LCAP$_k$-1. If one of considered nets is not an input of the RRAM tiling netlist, then a message indicating that the verification is failed is output.

At step 204, boolean functions are evaluated and assigned to nets encountered when moving around the RRAM tiling netlist starting from inputs toward memories and flip-flops, and property "netlist_part" of all encountered nets and cells is set to value 1, MARKED_CELLS being a set of encountered cells that are not evaluated yet, PROCESSED_CELLS being a set of encountered cells that are already evaluated. In an exemplary embodiment of the step 204, the following sub-steps are implemented:

(i) For each net NET examined at the step 202, consider the cells whose inputs are connected to the net NET and append these cells to the set MARKED_CELLS;

(ii) While the set MARKED_CELLS is not empty and there are at least one cell in this set that are ready for evaluation, implementing the following sub-steps:

i) Take (and remove) a cell CELL that is ready for evaluation from the set MARKED_CELLS, and append this cell to the set PROCESSED_CELLS;

ii) Examine all the nets INP_NET connected to inputs of the cell CELL;

iii) Check if the values of property "memory_number" of nets INP_NET are 0 or k. If the values are neither 0 nor k, then output a message indicating that the verification is failed; otherwise, set the property of the cell CELL: memory_number=k; and iv) Check if the values of property "netlist_part" of nets INP_NET are 0 or 1. If the values are neither 0 or 1, then output a message indicating that the verification is failed; otherwise, set the property of the cell CELL: netlist_part=1; and (iii) If the set MARKED_CELLS is not empty after implementing the foregoing sub-step (ii) of the step 204 (thus it contains only the cells that are not ready for evaluation), output a message indicating that the verification is failed.

In the foregoing sub-step (ii) of the step 204, if the cell CELL is either a logical cell or a flip-flop, then consider the values of property "clock_number" of examined nets INP_NET: if both values 1 and 2 are presented, then output a message indicating that the verification is failed; if only values 0 and 1 are presented, set the property of the cell CELL: clock_number=1; if only values 0 and 2 are presented, set the property of the cell CELL:clock_number=2; if only value 0 is presented, set the property of the cell CELL:clock_number=0.

In the foregoing sub-step (ii) of the step 204, if the cell CELL is a flip-flop, then consider the boolean function assigned to the net connected to the clock input of flip-flop CELL. If this boolean function is not equal to boolean the variable "clock", then output a message indicating that the verification is failed.

In the foregoing sub-step (ii) of the step 204, if the cell CELL is an internal RRAM memory cell, the following sub-steps are implemented:

(i) Consider the boolean functions assigned to the nets connected to the clock inputs CLKA and CLKB of the memory CELL. If at least one of these boolean functions is not equal to the boolean variable "clock", then output a message indicating that the verification is failed;

(ii) Consider the nets connected to inputs CLKA, ENA, DIA, WEA, AADR of the memory CELL. If at least one of these nets has the property clock_number=2, output a message indicating that the verification is failed;

(iii) Consider the nets connected to inputs CLKB, ENB, DIB, WEB, BADR of the memory CELL. If at least one of these nets has the property clock_number=1, output a message indicating that the verification is failed; and (iv) Consider nets connected to the following pairs of memory CELL inputs: ENA and ENB, DIA[s] and DIB[s], WEA[s] and WEB[s], AADR[t] and BADR[t], where s=0, 1, . . . , W$_{CELL}$-1, t=0, 1, . . . , where LCAP$_{CELL}$-1, W$_{CELL}$ is a width of memory CELL, CAP$_{CELL}$ is a capacity of the memory CELL, and LCAP$_{CELL}$ is the minimal integer number that is no less than log$_2$CAP$_{CELL}$. If there is at least one pair of nets that have the different boolean functions, output a message indicating that the verification is failed.

In the foregoing sub-step (ii) of the step 204, if the cell CELL is a logical cell, the following sub-steps are implemented:

(i) Examine all the outputs of a logical cell CELL and the nets OUT_NET connected to these outputs;

(ii) Set the values of properties of the examined net OUT_NET: memory_number=k, netlist_part=1, and "clock_number" being the same as the "clock_number" of the cell CELL;

(iii) Evaluate the function of the examined net OUT_NET and assign this function to this net OUT_NET. This may be implemented by applying the boolean operation determined by the cell CELL to the boolean functions assigned to nets connected to inputs of the cell CELL (For example, if the cell CELL is of a type AND2, and the boolean functions assigned to nets connected to inputs of this cell are F1 and F2, then the boolean function F1 & F2 is assigned to the net OUT_NET connected to the output of cell); and (iv) Consider the cells whose inputs are connected to the examined net OUT_NET and append these cells to the set MARKED_CELLS.

At step 206, one may find equivalent pairs of bits $(x_{a,b})$ stored in the memory Mem$_k$ and bits $(y_{i,j})$ stored in internal memories of the RRAM tiling netlist, and assign a "dummy" variable $z_{Z\_MEM\_NUM}$ to a bit $y_{i,j}$ of the internal memories when the bit $y_{i,j}$ has no equivalent bit in the memory Mem$_k$. All the internal RRAM memories M from the set PROCESSED_CELLS may be examined. For each examined memory M, one may denote W$_M$ as a width of the memory M, CAP$_M$ as a capacity of the memory M, LCAP$_M$ as the minimal integer number that is not less than log$_2$ CAP$_M$. In an exemplary embodiment of the step 206, the following sub-steps are implemented:

(i) For each i=0, 1, . . . , W$_M$, and each j=0, 1, . . . , CAP$_M$-1, define the boolean function $y_{i,j}$, as follows:

i) Define three boolean functions $F\_ADR_{i,j}=F(ENA)$&$(AADR==j)$&$(addr<CAP_k)$, $F\_WE_{i,j}=F(WEA[i])$&$F\_ADR_{i,j}$ and $F\_DI_{i,j}=F(DIA[i])$&$F\_WE_{i,j}$, where $F(ENA)$, $F(WEA[i])$ and $F(DIA[i])$ are the boolean functions assigned to the nets connected to the inputs ENA, WEA[i] and DIA[i] of the memory M, respectfully. The boolean function $(addr<CAP_k)$ is the function that depends from the boolean variables $addr_0$, $addr_1, \ldots, addr_{LCAPk-1}$ and takes the value 1 if and only if the number addr (those binary presentation is $addr_{LCAPk-1}$, $addr_{LCAPk-2}, \ldots, addr_1, addr_0$) is less than the capacity $CAP_k$ of the memory $Mem_k$. The boolean function $(AADR==j)$ may be presented as $(AADR==j)=(F(AADR[0])==j_0)$&$(F(AADR[1])==j_1)$& $\ldots$ &$(F(AADR[q])==j_q)$, where $F(AADR[s])$ is the boolean function assigned to the net connected to the input AADR[s] of the memory M, $s=0, 1, \ldots, q$, $q=LCAP_M-1$, and $j_q j_{q-1} \ldots j_1 j_0$ is the binary presentation of the number j;

ii) One may try to find the pair (a,b) of integer numbers such that $0<=a<W_k$, $0<=b<CAP_k-1$, and that $F\_WE_{i,j}=$enable &$we_a$&$(addr==b)$ and $F\_DI_{i,j}=$enable &$we_a$&$(addr==b)$&$di_a$, where the boolean function $(addr==b)$ may be presented as $(addr==b)=(addr_0==b_0)$&$(addr_1==b_1)$& $\ldots$ &$(addr_q==b_q)$, where $q=LCAP_k-1$, and $b_q b_{q-1} \ldots b_1 b_0$ is the binary presentation of the number b; and iii) If the numbers a and b have been successfully found, then assign $y_{i,j}=x_{a,b}$; otherwise, assign $y_{ij}=z_{Z\_VAR\_NUM}$ and set Z_VAR_NUM=Z_VAR_NUM+1;

(ii) Examine each $i=0, 1, \ldots, W_M-1$. Denote A_OUT_NET and B_OUT_NET to be nets that are connected to the memory M outputs DOA[i] and DOB[i];

(iii) Set the values of properties for both nets: memory_number=k, netlist_part=2. For the net A_OUT_NET, set clock_number=1; for the net B_OUT_NET, set clock_number=2;

(iv) Assign the following boolean functions to both nets A_OUT_NET and B_OUT_NET: $((y_{i,0}$& $F\_ADR_{i,0})|(y_{i,1}$& $F\_ADR_{i,1})| \ldots |(y_{i,q}$& $F\_ADR_{i,q}))$, where $q=CAP_M-1$; and (v) Append the cells whose inputs are connected to the nets A_OUT_NET and B_OUT_NET to the set MARKED_CELLS.

At step 208, boolean functions are assigned to nets connected to outputs of internal RRAM memories and flip-flops sets. In an exemplary embodiment, all the flip-flops FF from the set PROCESSED_CELLS are examined. For each flip-flop FF, consider two nets D_NET and Q_NET connected to data input and data output of the flip-flop. For the net Q_NET, set the values of properties: memory_number=k, and netlist_part=2. One may set the same value of the property "clock_number" for the net Q_NET as the value of the property "clock_number" of the net D_NET. Append the cells whose inputs are connected to the net Q_NET to the set MARKED_CELLS.

At step 210, boolean functions are evaluated and assigned to nets encountered when moving around the RRAM tiling netlist starting from outputs of memories and flip-flops of the RRAM tiling netlist toward outputs of the RRAM tiling netlist, and property "netlist_part" of all encountered nets and cells to is set to a value 2. In an exemplary embodiment of the step 210, the following sub-steps are implemented:

(i) While the set MARKED_CELLS is not empty and there are some cells in this set that are ready for evaluation, implementing the following sub-steps:

i) Take (and remove) a cell CELL that is ready for evaluation from the set MARKED_CELLS. Append this cell to the set PROCESSED_CELLS. If the cell CELL is not a logical cell (thus the cell CELL is a memory or a flip-flop), then output a message indicating that the verification is failed;

ii) Examine all the nets INP_NET connected to input of the cell CELL;

iii) Check if the values of property "memory_number" of nets INP_NET are 0 or k. If the values are neither 0 nor k, then output a message indicating that the verification is failed; otherwise, set the property of the cell CELL: memory_number=k;

iv) Check if the values of property "netlist_part" of nets INP_NET are 0 or 2. If the values are neither 0 nor 2, then output a message indicating that the verification is failed; otherwise, set the property of the cell CELL: netlist_part=2;

v) Consider the values of property "clock_number" of nets INP_NET. If both values 1 and 2 are presented, then output a message indicating that the verification is failed. Set the property of the cell CELL: clock_number=1 if only values 0 and 1 are presented; clock_number=2 if only values 0 and 2 are presented; and clock_number=0 if only value 0 is presented;

vi) Examine all the outputs of the logical cell CELL and the nets OUT_NET connected to these outputs;

vii) Set the values of properties of the examined net OUT_NET: memory_number=k, netlist_part=2, "clock_number" being the same as the "clock_number" of the cell CELL;

viii) Evaluate the function of the examined net OUT_NET and assign this function to this net OUT_NET. This may be done by applying the boolean operation determined by the cell CELL to the boolean functions assigned to nets connected to inputs of the cell CELL; and ix) Consider the cells whose inputs are connected to the examined net OUT_NET and append these cells to the set MARKED_CELLS; and (ii) If the set MARKED_CELLS is not empty after implementing the foregoing sub-step (i) of the step 210 (thus, it contains only the cells that are not ready for evaluation), a message indicating that the verification is failed is output.

At step 212, the outputs of the RRAM tiling netlist that correspond to outputs of the memory $Mem_k$ are analyzed, and it is ensured that boolean functions of the outputs of the RRAM tiling netlist are evaluated and correct. In an exemplary embodiment, one may examine $i=0, 1, \ldots, W_k-1$. For each i, consider two nets of the RRAM tiling netlist: $NET(DOA[i], Mem_k)$ and $NET(DOB[i], Mem_k)$. If at least one of these nets is not the output of the RRAM tiling netlist, or at least one of them has the value of the property "memory_number" not equal to k, or at least one of them has the value of the property "netlist_part" not equal to 2, or at least one of them is not evaluated, or the net $NET(DOA[i], Mem_k)$ has the value of the property "clock_number" not equal to 1, or the net $NET(DOB[i], Mem_k)$ has the value of the property "clock_number" not equal to 2, a message indicating that the verification is failed is output. After that, one may consider the boolean functions that are assigned to these two nets. If at least one of these two boolean functions is not equal to the boolean function (enable&$(x_{i,0}$&$(addr==0)|x_{i,j}$&$(addr==1)| \ldots | x_{i,CAPk-1}$&$(addr==CAP_k-1)))$, where the boolean functions $(addr==b)$, $b=0, 1, \ldots$, $CAP_k-1$, are defined at the step 206, then a message indicating that the verification is failed is output.

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a computer-readable medium including stored computer code which is used to program a computer to perform the disclosed function and process of the present invention. The computer-readable medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of verification of a RRAM tiling netlist, comprising steps of:
   setting properties "memory_number", "clock_number" and "netlist_part" of all nets and cells of a RRAM tiling netlist to a value 0;
   assigning a boolean value 0 to all ground nets included in the nets of said RRAM tiling netlist, and assigning a boolean value 1 to all power nets included in the nets of said RRAM tiling netlist;
   verifying said RRAM tiling netlist for each customer memory $Mem_k$, including analyzing inputs of the RRAM tiling netlist that correspond to inputs of said memory $Mem_k$, wherein k is an integer; and
   outputting a message indicating verification of said RRAM tiling netlist is successful.

2. The method of claim 1, wherein said verifying step comprising sub-steps of:
   (a) assigning a boolean variable to each of said inputs of said RRAM tiling netlist;
   (b) evaluating and assigning boolean values to nets encountered when moving around said RRAM tiling netlist starting from inputs toward memories and flip-flops, and setting property "netlist_part" of all encountered nets and cells to a value 1, MARKED_CELLS being a set of encountered cells that are not evaluated yet, PROCESSED_CELLS being a set of encountered cells that are already evaluated;
   (c) finding equivalent pairs of bits $(x_{a,b})$ stored in said memory $Mem_k$ and bits $(y_{i,j})$ stored in internal memories of said RRAM tiling netlist, and assigning dummy variable $z_{Z\_MEM\_NUM}$ to a bit $y_{i,j}$ of said internal memories when said bit $y_{i,j}$ has no equivalent bit in said memory $Mem_k$;
   (d) assigning boolean values to nets connected to outputs of internal RRAM memories and flip-flops;
   (e) evaluating and assigning boolean values to nets encountered when moving around said RRAM tiling netlist starting from outputs of memories and flip-flops of said RRAM tiling netlist toward outputs of said RRAM tiling netlist, and setting property "netlist_part" of all encountered nets and cells to a value 2; and
   (f) analyzing said outputs of said RRAM tiling netlist that correspond to outputs of said memory $Mem_k$, and ensuring that boolean values of said outputs of said RRAM tiling netlist are evaluated and correct.

3. The method of claim 2, wherein said sub-step (a) comprising:
   defining boolean variables that are used for construction of boolean values and assigned to nets of said RRAM tiling netlist, said Boolean variables including "clock", "enable", "$addr_r$", "$we_s$", "$di_s$", "$x_{s,r}$", s=0, 1, . . . , $W_k-1$, t=0, 1, . . . , $LCAP_k-1$, r=0, 1, . . . , $CAP_k-1$, defining infinite set of variables "$z_1$", "$z_2$", "$z_3$", . . . , and setting Z_VAR_NUM=0, Z_VAR_NUM being a number of used variables "z";
   cleaning said sets MARKED_CELLS and PROCESSED_CELLS;
   examining all nets NET(A_INPUT, $Mem_k$) of said RRAM tiling netlist for each input A_INPUT of said memory $Mem_k$ driven by clock CLKA, said input A_INPUT including inputs CLKA, ENA, DIA[0:$W_k$-1], WEA[0:$W_k$-1], and AADR[0:$LCAP_k$-1]), checking whether a value of property "memory_number" of each examined net NET is 0, outputting a message indicating that verification of said RRAM tiling netlist is failed when said value of property "memory_number" of an examined net NET is not 0, and setting properties of said net NET as follows: memory_number=k, clock_number=1, and netlist_part=1 when said value of property "memory_number" of all examined net NET is 0;
   examining all nets NET(B_INPUT, $Mem_k$) of said RRAM tiling netlist for each input B_INPUT of said memory $Mem_k$ driven by clock CLKB, said input B_INPUT including inputs CLKB, ENB, DIB[0:$W_k$-1], WEB[0:$W_k$-1], and BADR[0:$LCAP_k$-1]), checking whether a value of property "memory_number" of each examined net NET is 0, outputting a message indicating that verification of said RRAM tiling netlist is failed when said value of property "memory_number" of an examined net NET is not 0, and setting properties of said net NET as follows: memory_number=k, clock_number=2, and netlist_part=1 when said value of property "memory_number" of all examined net NET is 0; and
   assigning said boolean variable "clock" to nets NET(CLKA, $Mem_k$) and NET(CLKB, $Mem_k$), assigning said boolean variable "enable" to nets NET(ENA, $Mem_k$) and NET(ENB, $Mem_k$), assigning said boolean variable "$di_s$" to nets NET(DIA[s], $Mem_k$) and NET(DIB[s], $Mem_k$), assigning said boolean variable "$we_s$" to nets NET(WEA[s], $Mem_k$) and NET(WEB[s], $Mem_k$), where s=0, 1, . . . , $W_k-1$, assigning said boolean variable "addr$_t$" to nets NET(AADR[t], Mem$_k$) and NET(BADR[t], Mem$_k$), where t=0,1, . . . ,LCAP$_k$-1, and outputting a message indicating that verification of said RRAM tiling netlist is failed when one of considered nets is not an input of said RRAM tiling netlist.

4. The method of claim 3, wherein said sub-step (b) comprising sub-steps of:
(aa) considering cells whose inputs are connected to each examined net NET, and appending said considered cells to said set MARKED_CELLS;
(bb) when said set MARKED_CELLS is not empty and includes one cell CELL ready for evaluation, implementing following sub-steps:
  (aaa) removing said cell CELL ready for evaluation from said set MARKED_CELLS and appending said cell CELL to said set PROCESSED_CELLS;
  (bbb) examining all nets INP_NET connected to inputs of said cell CELL;
  (ccc) checking if values of property "memory_number" of said nets INP_NET are 0 or k, outputting a message indicating that verification of said RRAM tiling netlist is failed when said values of property "memory_number" of said nets INP_NET are neither 0 nor k, and setting property of said cell CELL as memory_number=k when said values of property "memory_number" of said nets INP_NET are either 0 or k; and
  (ddd) checking if values of property "netlist_part" of said nets INP_NET are 0 or 1, outputting a message indicating that verification of said RRAM tiling netlist is failed when said values of property "netlist_part" of said nets INP_NET are neither 0 nor 1, and setting property of said cell CELL as netlist_part=1 when said values of property "netlist_part" of said nets INP_NET are either 0 or 1; and
(cc) outputting a message indicating that verification of said RRAM tiling netlist is failed when said set MARKED_CELLS is not empty after implementing said sub-step (bb).

5. The method of claim 4, wherein said sub-step (bb) further comprising, when said cell CELL is either a logical cell or a flip-flop,
considering values of property "clock_number" of examined nets INP_NET: outputting a message indicating that verification of said RRAM tiling netlist is failed if both values 1 and 2 are presented; setting property of said cell CELL as clock_number=1 if only values 0 and 1 are presented; setting property of said cell CELL as clock_number=2 if only values 0 and 2 are presented; and setting property of said cell CELL as clock_number=0, if only value 0 is presented.

6. The method of claim 4, wherein said sub-step (bb) further comprising, when said cell CELL is a flip-flop cell,
considering a boolean value assigned to a net connected to a clock input of said flip-flop CELL, and outputting a message indicating that verification of said RRAM tiling netlist is failed if said boolean value is not equal to said boolean variable "clock".

7. The method of claim 4, wherein said sub-step (bb) further comprising, when said cell CELL is an internal RRAM memory cell,
considering boolean values assigned to nets connected to said clock inputs CLKA and CLKB of said internal RRAM memory CELL, and outputting a message indicating that verification of said RRAM tiling netlist is failed if at least one of said boolean values is not equal to said boolean variable "clock";
considering nets connected to inputs CLKA, ENA, DIA, WEA, AADR of said memory CELL, and outputting a message indicating that verification of said RRAM tiling netlist is failed if at least one of said nets has property clock_number=2;
considering nets connected to inputs CLKB, ENB, DIB, WEB, BADR of said memory CELL, and outputting a message indicating that verification of said RRAM tiling netlist is failed if at least one of said nets has property clock_number=1; and
considering nets connected to following pairs of memory CELL inputs: ENA and ENB, DIA[s] and DIB[s], WEA[s] and WEB[s], AADR[t] and BADR[t], where s=0, 1, . . . , W$_{CELL}$-1, t=0, 1, . . . , LCAP$_{CELL}$-1, W$_{CELL}$ being a width of said memory CELL, CAP$_{CELL}$ being a capacity of said memory CELL, and LCAP$_{CELL}$ being a minimal integer number no less than log$_2$ CAP$_{CELL}$, and outputting a message indicating that verification of said RRAM tiling netlist is failed if there is at least one pair of nets that have different boolean values.

8. The method of claim 4, wherein said sub-step (bb) further comprising, when said cell CELL is a logic cell,
examining all outputs of said logical cell CELL and nets OUT_NET connected to said outputs of said logical cell CELL;
setting values of properties of said examined net OUT_NET as memory_number=k, netlist_part=1, and "clock_number" being same as "clock_number" of said cell CELL;
evaluating a function of said examined net OUT_NET and assigning said function to said net OUT_NET; and
considering cells whose inputs are connected to said examined net OUT_NET, and appending said cells to said set MARKED_CELLS.

9. The method of claim 2, wherein said sub-step (c) comprises examining all internal RRAM memories from said set PROCESSED_CELLS.

10. The method of claim 2, wherein said sub-step (d) comprising:
examining all flip-flops FF from said set PROCESSED_CELLS;
for each flip-flop FF, considering two nets D_NET and Q_NET connected to data input and data output of said flip-flop F: for said net Q_NET, setting values of properties as memory_number=k, and netlist_part=2, and setting values of property "clock_number" for said net Q_NET same as values of property "clock_number" for said net D_NET; and
appending cells whose inputs are connected to said net Q_NET to said set MARKED_CELLS.

11. A computer-readable medium having computer-executable instructions for performing a method of verification of a RRAM tiling netlist, said method comprising steps of:
setting properties "memory_number", "clock_number" and "netlist_part" of all nets and cells of a RRAM tiling netlist to a value 0;
assigning a boolean value 0 to all ground nets included in the nets of said RRAM tiling netlist, and assigning a boolean value 1 to all power nets included in the nets of said RRAM tiling netlist;
verifying said RRAM tiling netlist for each customer memory Mem$_k$, including analyzing inputs of the RRAM tiling netlist that correspond to inputs of said memory Mem$_k$, wherein k is an integer; and outputting a message indicating verification of said RRAM tiling netlist is successful.

12. The computer-readable medium of claim 11, wherein said verifying step comprising sub-steps of:
   (a) assigning a boolean variable to each of said inputs of said RRAM tiling netlist;
   (b) evaluating and assigning boolean values to nets encountered when moving around said RRAM tiling netlist starting from inputs toward memories and flip-flops, and setting property "netlist_part" of all encountered nets and cells to a value 1, MARKED_CELLS being a set of encountered cells that are not evaluated yet, PROCESSED_CELLS being a set of encountered cells that are already evaluated;
   (c) finding equivalent pairs of bits ($x_{a,b}$) stored in said memory $Mem_k$ and bits ($y_{i,j}$) stored in internal memories of said RRAM tiling netlist, and assigning dummy variable $z_{Z\_MEM\_NUM}$ to a bit $y_{i,j}$ of said internal memories when said bit $y_{i,j}$ has no equivalent bit in said memory $Mem_k$;
   (d) assigning boolean values to nets connected to outputs of internal RRAM memories and flip-flops;
   (e) evaluating and assigning boolean values to nets encountered when moving around said RRAM tiling netlist starting from outputs of memories and flip-flops of said RRAM tiling netlist toward outputs of said RRAM tiling netlist, and setting property "netlist_part" of all encountered nets and cells to a value 2; and
   (f) analyzing said outputs of said RRAM tiling netlist that correspond to outputs of said memory $Mem_k$, and ensuring that boolean values of said outputs of said RRAM tiling netlist are evaluated and correct.

13. The computer-readable medium of claim 12, wherein said sub-step (a) comprising:
   defining boolean variables that are used for construction of boolean values and assigned to nets of said RRAM tiling netlist, said Boolean variables including "clock", "enable", "$addr_t$", "$we_s$", "$di_s$", "$x_{s,r}$", $s=0, 1, \ldots, W_k-1$, $t=0, 1, \ldots, LCAP_k-1$, $r=0, 1, \ldots, CAP_k-1$, defining infinite set of variables "$z_1$", "$z_2$", "$z_3$", ..., and setting Z_VAR_NUM=0, Z_VAR_NUM being a number of used variables "z";
   cleaning said sets MARKED_CELLS and PROCESSED_CELLS;
   examining all nets NET(A_INPUT, $Mem_k$) of said RRAM tiling netlist for each input A_INPUT of said memory $Mem_k$ driven by clock CLKA, said input A_INPUT including inputs CLKA, ENA, DIA[0:$W_k$-1], WEA[0:$W_k$-1], and AADR[0:$LCAP_k$-1]), checking whether a value of property "memory_number" of each examined net NET is 0, outputting a message indicating that verification of said RRAM tiling netlist is failed when said value of property "memory_number" of an examined net NET is not 0, and setting properties of said net NET as follows: memory_number=k, clock_number=1, and netlist_part=1 when said value of property "memory_number" of all examined net NET is 0;
   examining all nets NET(B_INPUT, $Mem_k$) of said RRAM tiling netlist for each input B_INPUT of said memory $Mem_k$ driven by clock CLKB, said input B_INPUT including inputs CLKB, ENB, DIB[0:$W_k$-1], WEB[0:$W_k$-1], and BADR[0:$LCAP_k$-1]), checking whether a value of property "memory_number" of each examined net NET is 0, outputting a message indicating that verification of said RRAM tiling netlist is failed when said value of property "memory_number" of an examined net NET is not 0, and setting properties of said net NET as follows: memory_number=k, clock_number=2, and netlist_part=1 when said value of property "memory_number" of all examined net NET is 0; and
   assigning said boolean variable "clock" to nets NET(CLKA, $Mem_k$) and NET(CLKB, $Mem_k$), assigning said boolean variable "enable" to nets NET(ENA, $Mem_k$) and NET(ENB, $Mem_k$), assigning said boolean variable "$di_s$" to nets NET(DIA[s], $Mem_k$) and NET(DIB[s], $Mem_k$), assigning said boolean variable "$we_s$" to nets NET(WEA[s], $Mem_k$) and NET(WEB[s], $Mem_k$), where $s=0, 1, \ldots, W_k-1$, assigning said boolean variable "$addr_t$" to nets NET(AADR[t], $Mem_k$) and NET(BADR[t], $Mem_k$), where $t=0, 1, \ldots, LCAP_k-1$, and outputting a message indicating that verification of said RRAM tiling netlist is failed when one of considered nets is not an input of said RRAM tiling netlist.

14. The computer-readable medium of claim 13, wherein said sub-step (b) comprising sub-steps of:
   (aa) considering cells whose inputs are connected to each examined net NET, and appending said considered cells to said set MARKED_CELLS;
   (bb) when said set MARKED_CELLS is not empty and includes one cell CELL ready for evaluation, implementing following sub-steps:
      (aaa) removing said cell CELL ready for evaluation from said set MARKED_CELLS and appending said cell CELL to said set PROCESSED_CELLS;
      (bbb) examining all nets INP_NET connected to inputs of said cell CELL;
      (ccci) checking if values of property "memory_number" of said nets INP_NET are 0 or k, outputting a message indicating that verification of said RRAM tiling netlist is failed when said values of property "memory_number" of said nets INP_NET are neither 0 nor k, and setting property of said cell CELL as memory_number=k when said values of property "memory_number" of said nets INP_NET are either 0 or k; and
      (ddd) checking if values of property "netlist_part" of said nets INP_NET are 0 or 1, outputting a message indicating that verification of said RRAM tiling netlist is failed when said values of property "netlist_part" of said nets INP_NET are neither 0 nor 1, and setting property of said cell CELL as netlist_part=1 when said values of property "netlist_part" of said nets INP_NET are either 0 or 1; and
   (cc) outputting a message indicating that verification of said RRAM tiling netlist is failed when said set MARKED_CELLS is not empty after implementing said sub-step (bb).

15. The computer-readable medium of claim 14, wherein said sub-step (bb) further comprising, when said cell CELL is either a logical cell or a flip-flop,
   considering values of property "clock_number" of examined nets INP_NET: outputting a message indicating that verification of said RRAM tiling netlist is failed if both values 1 and 2 are presented; setting property of said cell CELL as clock_number=1 if only values 0 and 1 are presented; setting property of said cell CELL as clock_number=2 if only values 0 and 2 are presented; and setting property of said cell CELL as clock_number=0, if only value 0 is presented.

16. The computer-readable medium of claim 14, wherein said sub-step (bb) further comprising, when said cell CELL is a flip-flop, considering a boolean value assigned to a net connected to a clock input of said flip-flop CELL, and outputting a message indicating that verification of said RRAM tiling netlist is failed if said boolean value is not equal to said boolean variable "clock".

17. The computer-readable medium of claim 14, wherein said sub-step (bb) further comprising, when said cell CELL is an internal RRAM memory cell, considering boolean values assigned to nets connected to said clock inputs CLKA and CLKB of said internal RRAM memory CELL, and outputting a message indicating that verification of said RRAM tiling netlist is failed if at least one of said boolean values is not equal to said boolean variable "clock";

considering nets connected to inputs CLKA, ENA, DIA, WEA, AADR of said memory CELL, and outputting a message indicating that verification of said RRAM tiling netlist is failed if at least one of said nets has property clock_number=2;

considering nets connected to inputs CLKB, ENB, DIB, WEB, BADR of said memory CELL, and outputting a message indicating that verification of said RRAM tiling netlist is failed if at least one of said nets has property clock_number=1; and considering nets connected to following pairs of memory CELL inputs: ENA and ENB, DIA[s] and DIB[s], WEA[s] and WEB[s], AADR[t] and BADR[t], where s=0, 1, ..., $W_{CELL}-1$, t=0, 1, ..., $LCAP_{CELL}-1$, $W_{CELL}$ being a width of said memory CELL, $CAP_{CELL}$ being a capacity of said memory CELL, and $LCAP_{CELL}$ being a minimal integer number no less than $\log_2 CAP_{CELL}$, and outputting a message indicating that verification of said RRAM tiling netlist is failed if there is at least one pair of nets that have different boolean values.

18. The computer-readable medium of claim 14, wherein said sub-step (bb) further comprising, when said cell CELL is a logic cell, examining all outputs of said logical cell CELL and nets OUT_NET connected to said outputs of said logical cell CELL;

setting values of properties of said examined net OUT_NET as memory_number=k, netlist_part=1, and "clock_number" being same as "clock_number" of said cell CELL;

evaluating a function of said examined net OUT_NET and assigning said function to said net OUT_NET; and considering cells whose inputs are connected to said examined net OUT_NET, and appending said cells to said set MARKED_CELLS.

19. The computer-readable medium of claim 12, wherein said sub-step (c) comprises examining all internal RRAM memories from said set PROCESSED_CELLS.

20. The computer-readable medium of claim 12, wherein said sub-step (d) comprising:

examining all flip-flops FF from said set PROCESSED_CELLS;

for each flip-flop FF, considering two nets D_NET and Q_NET connected to data input and data output of said flip-flop F: for said net Q_NET, setting values of properties as memory_number=k, and netlist_part=2, and setting values of property "clock_number" for said net Q_NET same as values of property "clock_number" for said net D_NET; and appending cells whose inputs are connected to said net Q_NET to said set MARKED_CELLS.

* * * * *